United States Patent
Lin et al.

(10) Patent No.: US 9,472,605 B2
(45) Date of Patent: Oct. 18, 2016

(54) ORGANIC LIGHT-EMITTING DIODE DISPLAY WITH ENHANCED APERTURE RATIO

(71) Applicant: Apple Inc., Cupertino, CA (US)

(72) Inventors: Chin-Wei Lin, Cupertino, CA (US); Jae Won Choi, Cupertino, CA (US); MinKyu Kim, Cupertino, CA (US); Shih Chang Chang, Cupertino, CA (US); Tsung-Ting Tsai, Taipei (TW); Vasudha Gupta, Cupertino, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/543,088

(22) Filed: Nov. 17, 2014

(65) Prior Publication Data

US 2016/0141348 A1 May 19, 2016

(51) Int. Cl.
*H01L 27/32* (2006.01)

(52) U.S. Cl.
CPC ....... *H01L 27/3265* (2013.01); *H01L 27/3248* (2013.01); *H01L 27/3258* (2013.01); *H01L 27/3262* (2013.01); *H01L 27/3272* (2013.01); *H01L 27/3276* (2013.01)

(58) Field of Classification Search
CPC ............. G09G 2300/0426; G09G 2300/0452; G09G 2320/0209
See application file for complete search history.

(56) References Cited

U.S. PATENT DOCUMENTS

| | | | |
|---|---|---|---|
| 6,858,991 B2 * | 2/2005 | Miyazawa | G09G 3/3241 315/169.3 |
| 7,167,169 B2 | 1/2007 | Libsch et al. | |
| 7,450,092 B2 | 11/2008 | Kim et al. | |
| 7,692,191 B2 | 4/2010 | Kwak et al. | |
| 8,358,299 B2 | 1/2013 | Chaji et al. | |
| 2012/0119667 A1* | 5/2012 | Kitazawa | G09G 3/3291 315/228 |
| 2012/0287103 A1 | 11/2012 | Wu et al. | |
| 2013/0306996 A1 | 11/2013 | Kitazawa et al. | |
| 2013/0307006 A1 | 11/2013 | Koshihara et al. | |
| 2014/0062331 A1* | 3/2014 | Nam | G09G 3/3233 315/226 |
| 2014/0176399 A1 | 6/2014 | Lee et al. | |
| 2014/0183476 A1 | 7/2014 | Kwon et al. | |

(Continued)

FOREIGN PATENT DOCUMENTS

| | | |
|---|---|---|
| EP | 1122794 | 8/2001 |
| EP | 1610389 | 12/2005 |
| EP | 1793425 | 6/2007 |

OTHER PUBLICATIONS

Lin, U.S. Appl. No. 14/071,428, filed Nov. 4, 2013.

*Primary Examiner* — Mohammad Islam
*Assistant Examiner* — Ankush Singal
(74) *Attorney, Agent, or Firm* — Treyz Law Group, P.C.; G. Victor Treyz; Michael H. Lyons (57) ABSTRACT

An organic light-emitting diode display may have an array of pixels. Each pixel may have an organic light-emitting diode with an anode and cathode. The anodes may be formed from a patterned layer of metal. Thin-film transistor circuitry in the pixels may include transistors such as drive transistors and switching transistors. Data lines may supply data signals to the pixels and horizontal control lines may supply control signals to the gates of the transistors. A switching transistor may be coupled between a voltage initialization line and each anode. The voltage initialization lines and capacitor structures in the thin-film transistor circuitry may be formed using a layer of metal that is different than the layer of metal that forms the anodes.

17 Claims, 10 Drawing Sheets

(56) References Cited

U.S. PATENT DOCUMENTS

| | | | |
|---|---|---|---|
| 2014/0184665 A1 | 7/2014 | Yoon et al. | |
| 2014/0239270 A1 | 8/2014 | Ko et al. | |
| 2014/0292622 A1* | 10/2014 | Lee | G09G 3/3233 345/80 |
| 2015/0053931 A1* | 2/2015 | Kim | H01L 27/124 257/40 |
| 2015/0123953 A1* | 5/2015 | Shim | G09G 3/3233 345/205 |
| 2015/0187249 A1* | 7/2015 | Tani | G09G 3/006 345/394 |
| 2015/0206931 A1* | 7/2015 | Choi | H01L 27/3272 257/72 |
| 2015/0294626 A1* | 10/2015 | Bi | G09G 3/3233 345/211 |
| 2016/0063921 A1* | 3/2016 | Tsai | G09G 3/3258 345/76 |
| 2016/0125789 A1* | 5/2016 | Choi | G09G 3/2074 345/694 |

\* cited by examiner

ORGANIC LIGHT-EMITTING DIODE DISPLAY WITH ENHANCED APERTURE RATIO

BACKGROUND

This relates generally to displays, and, more particularly, to organic light-emitting diode displays.

Electronic devices often include displays. Organic light-emitting diode displays may exhibit desirable attributes such as a wide field of view, compact size, and low power consumption.

Organic light-emitting diode displays have arrays of pixels. Each pixel may contain an organic light-emitting diode and thin-film transistor circuitry that that controls current flow through the organic light-emitting diode. Storage capacitors may be used to store data between successive image frames.

It can be challenging to form an organic light-emitting diode display. If care is not taken, the structures that form the thin-film transistor circuitry for controlling the pixels may consume more area than desired, thereby restricting the amount of light-emitting area per pixel (i.e., limiting the aperture ratio of the pixels). It may also be difficult to form storage capacitors without consuming more area within a pixel than desired.

It would therefore be desirable to be able to form an organic light-emitting diode display with enhanced aperture ratios and storage capacitor structures.

SUMMARY

An organic light-emitting diode display may have an array of pixels. Each pixel may have an organic light-emitting diode with an anode and cathode. The anodes may be formed from a patterned layer of metal.

Thin-film transistor circuitry in the pixels may include transistors such as drive transistors and switching transistors. Data lines may supply data signals to the pixels and horizontal control lines may supply control signals to the gates of the transistors. Voltage initialization lines may be used to distribute voltages to columns of the pixels for use during threshold voltage compensation operations.

A switching transistor may be coupled between a voltage initialization line and each anode. The voltage initialization lines and capacitor structures in the thin-film transistor circuitry may be formed using a layer of metal that is different than the layer of metal that forms the anodes.

DETAILED DESCRIPTION

Figure 1:
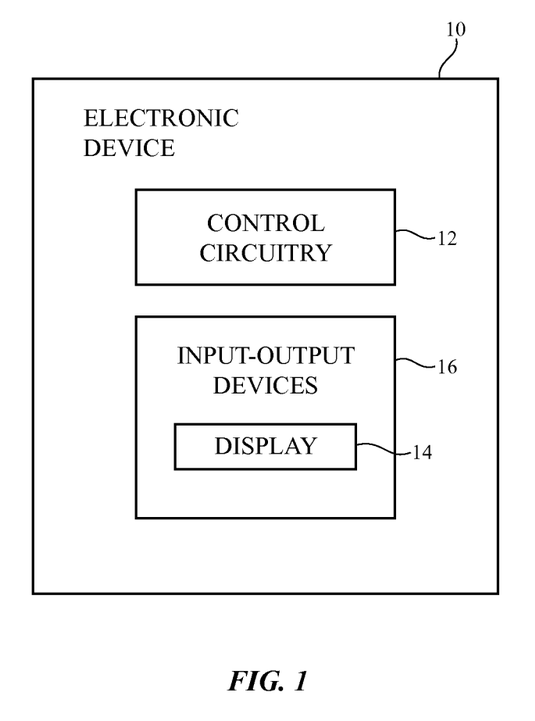
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
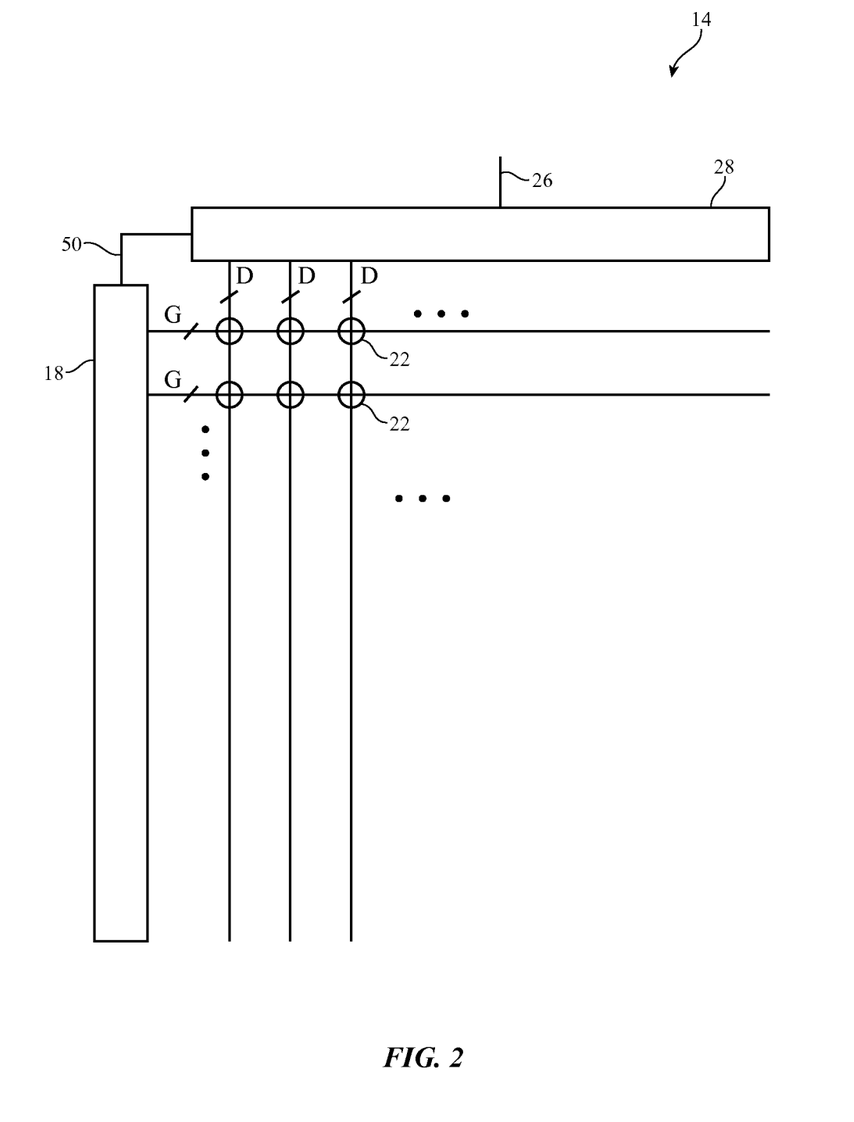
FIG. 2 is a diagram of an illustrative display in accordance with an embodiment.

Display 14 may be an organic light-emitting diode display. FIG. 2 is a diagram of an illustrative organic light-emitting diode display. As shown in FIG. 2, display 14 may have an array of pixels 22 for displaying images for a user. The array of pixels 22 may be arranged to from rows and columns. There may be any suitable number of rows and columns in the array of pixels 22 (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry may be used to control the operation of pixels 22. The display driver circuitry may be formed from integrated circuits, thin-film transistor circuits, or other suitable circuitry. Display driver circuitry 28 of FIG. 2 may contain communications circuitry for communicating with system control circuitry such as control circuitry 16 of FIG. 1 over path 26. Path 26 may be formed from traces on a flexible printed circuit or other cable. During operation, the control circuitry (e.g., control circuitry 16 of FIG. 1) may supply circuitry 28 with information on images to be displayed on display 14.

To display the images on display pixels 22, display driver circuitry 28 may supply image data to data lines D while issuing clock signals and other control signals to supporting display driver circuitry such as gate driver circuitry 18 over path 50. If desired, circuitry 28 may also supply clock signals and other control signals to gate driver circuitry on an opposing edge of display 14.

Gate driver circuitry 18 (sometimes referred to as horizontal control line control circuitry) may be implemented as part of an integrated circuit and/or may be implemented using thin-film transistor circuitry. Horizontal control lines G in display 14 may gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Each column of pixels 22 preferably includes a sufficient number of data lines to supply image data for all of the subpixels of that column (e.g., a red data line for carrying red data signals to red subpixels, a green data line for carrying green data signals to green subpixels, and a blue data line for carrying blue data signals to blue subpixels).

The circuitry for each subpixel may include an organic light-emitting diode, a drive transistor that controls current flow through the diode, and supporting transistors (e.g., switching transistors and emission enable control transistors). The supporting transistors may be used in performing data loading operations and threshold voltage compensation operations for the drive transistors. Each subpixel may have one or more capacitors. Storage capacitors may be used to store data signals between successive frames of data.

Figure 3:
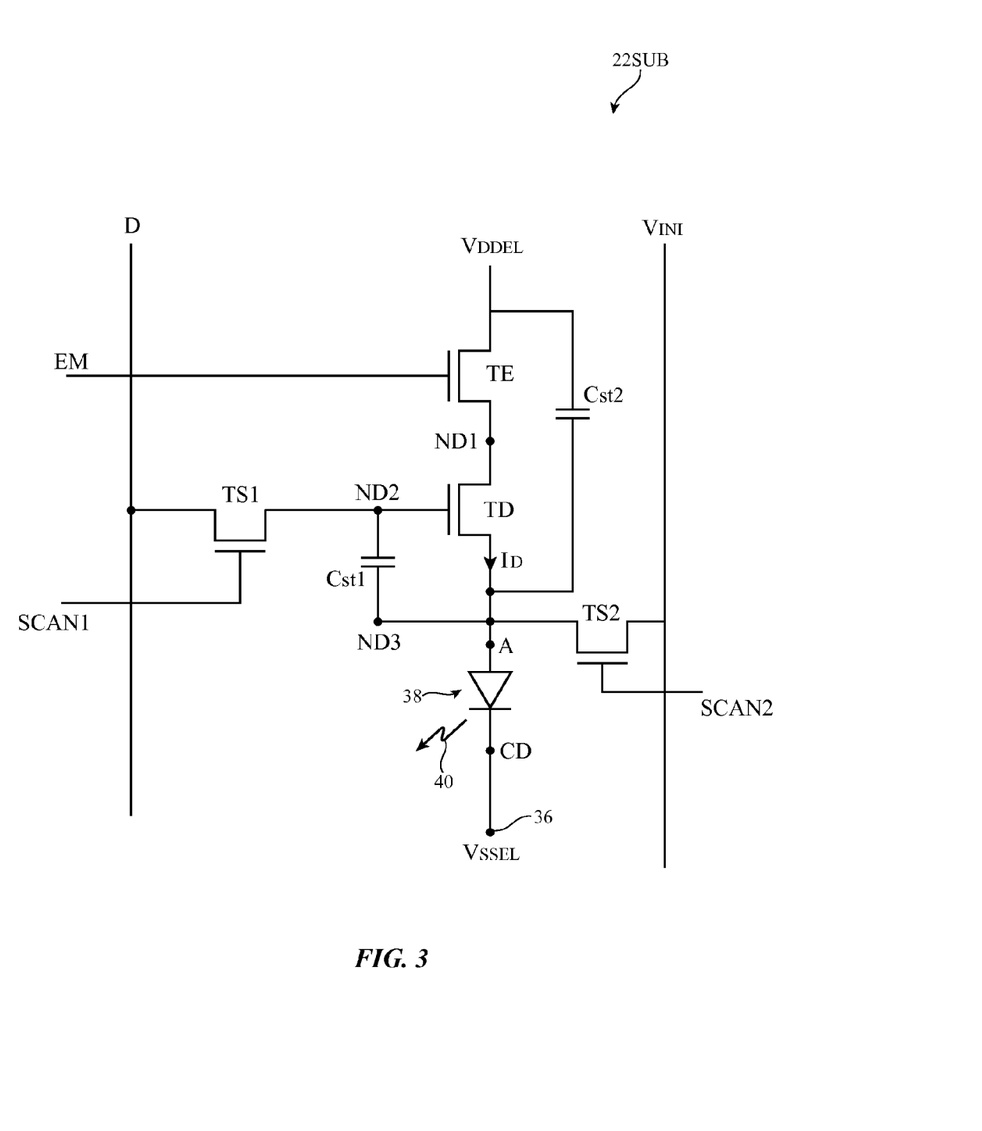
FIG. 3 is a diagram of an illustrative organic light-emitting diode pixel circuit in accordance with an embodiment.

A schematic diagram of an illustrative circuit for an organic light-emitting diode subpixel (pixel) is shown in FIG. 3. As shown in FIG. 3, each subpixel 22SUB may include an organic light-emitting diode such as organic light-emitting diode 38. Light-emitting diode 38 may emit colored light. For example, in a scenario in which subpixel 22SUB is a red subpixel, organic light-emitting diode 38 may emit red light. Blue subpixels may have blue diodes 38 that emit blue light and green subpixels may have green diodes 38 that emit green light. Arrangements for pixel 22 in which subpixels 22SUB have different colors (yellow, white, light blue, dark blue, etc.) may also be used.

In each subpixel 22SUB, the state of drive transistor TD controls the amount of drive current $I_D$ flowing through diode 38 and therefore the amount of emitted light 40 from subpixel 22SUB. Each diode 38 has an anode A and a cathode CD. Drive current $I_D$ flows between anode A and cathode CD. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). Each anode A is individually driven by a respective drive transistor TD.

To ensure that transistor TD is held in a desired state between successive frames of data, subpixel 22SUB may include a storage capacitor such as storage capacitor Cst1. The voltage on storage capacitor Cst1 is applied to the gate of transistor TD at node ND2 to control transistor TD (i.e., to control the magnitude of drive current $I_D$).

Data can be loaded into storage capacitor Cst1 using one or more switching transistors. One or more emission enable transistors may be used in controlling the flow of current through drive transistor TD. In the example of FIG. 3, scan signals SCAN1 and SCAN2 are applied to the gates of switching transistors TS1 and TS2. The SCAN1 and SCAN2 signals are used for controlling transistors TS1 and TS2 during threshold voltage compensation operations and data loading operations. The emission control signal EM is used to control emission enable transistor TE (e.g., to disable transistor TD during threshold voltage compensation and data loading operations).

Display driver circuitry 28 may supply initialization voltages to columns of pixels using vertical initialization voltages lines in each column. As shown in FIG. 3, initialization voltage line Vini may be used to supply an initialization voltage (i.e., a direct current bias voltage Vini) to terminal ND3 via transistor TS2 during threshold voltage compensation operations. Display driver circuitry 38 may use data line D to supply a reference voltage Vref to subpixel 22SUB during threshold voltage compensation operations. Subpixel 22SUB may receive a positive power supply voltage such as $V_{DDEL}$ and a ground power supply voltage such as $V_{SSEL}$. Stabilization capacitor Cst2 may be used to help stabilize node ND3 during threshold voltage compensation operations.

Using pixel circuitry of the type shown in FIG. 3, each subpixel (pixel) 22SUB may be compensated for pixel-to-pixel variations such as transistor threshold voltage variations in drive transistor TD. Compensation operations may be performed during a compensation period that includes an initialization phase and a threshold voltage generation phase. Following compensation (i.e., after the compensation operations of the compensation period have been completed), data may be loaded into the pixels. The data loading process, which is sometimes referred to as data programming, may take place during a programming period. In a color display, programming may involve demultiplexing data and loading demultiplexed data into red, green, and blue subpixels 22SUB (as an example). Following compensation and programming (i.e., after expiration of a compensation and programming period), the pixels of the row may be used to emit light. The period of time during which the pixels are being used to emit light (i.e., the time during which light-emitting diodes 38 emit light 40) is sometimes referred to as an emission period.

During the initialization phase, circuitry 18 may assert SCAN1 and SCAN2 (i.e., SCANT and SCAN2 may be taken high). This turns on transistors TS1 and TS2 so that reference voltage signal Vref from line D and initialization voltage signal Vini from the initialization voltage line are applied to nodes ND2 and ND3, respectively. During the threshold voltage generation phase of the compensation period, signal EM is asserted so that transistor TE is turned on and current $I_D$ flows through drive transistor TD to charge up the capacitance at node ND3. As the voltage at node ND3 increases, the current through drive transistor TD will be reduced because the gate-source voltage Vgs of drive transistor TD will approach the threshold voltage Vt of drive transistor TD. The voltage at node ND3 will therefore go to Vref−Vt. After compensation (i.e., after initialization and threshold voltage generation), data is programmed into the compensated display pixels. During programming, emission transistor TE is turned off by deasserting signal EM and a desired data voltage D is applied to node ND2 using data line D. The voltage at node ND2 after programming is display data voltage Vdata. The voltage at node ND3 rises because of coupling with node ND2. In particular, the voltage at node ND3 is taken to Vref−Vt+(Vdata−Vref)*K, where K is equal to Cst1/(Cst1+Cst2+Coled), where Coled is the capacitance associated with diode 38.

After compensation and programming operations have been completed, the display driver circuitry of display 14 places the compensated and programmed pixels into the emission mode (i.e., the emission period is commenced). During emission, signal EM is asserted for each compensated and programmed subpixel to turn on transistor TE. The voltage at node ND3 goes to Voled, the voltage associated with diode 38. The voltage at node ND2 goes to Vdata+ (Voled−(Vref−Vt)−(Vdata−Vref)*K. The value of Vgs-Vt for drive transistor TD is equal to the difference between the voltage Va of node ND2 and the voltage Vb of node ND3. The value of Va−Vb is (Vdata−Vref)*(1−K), which is independent of Vt. Accordingly, each subpixel 22SUB in the array of pixels in display 14 has been compensated for threshold voltage variations so that the amount of light 40 that is emitted by each subpixel 22SUB is proportional only to the magnitude of the data signal D for each of those subpixels.

The illustrative pixel circuit of FIG. 3 uses four transistors and two capacitors and may therefore sometimes be referred to as a 4T2C design. If desired, other pixel circuitry may be used in display 14 (e.g., 6T1C designs, etc.). The configuration of FIG. 3 is merely illustrative.

Figure 4:
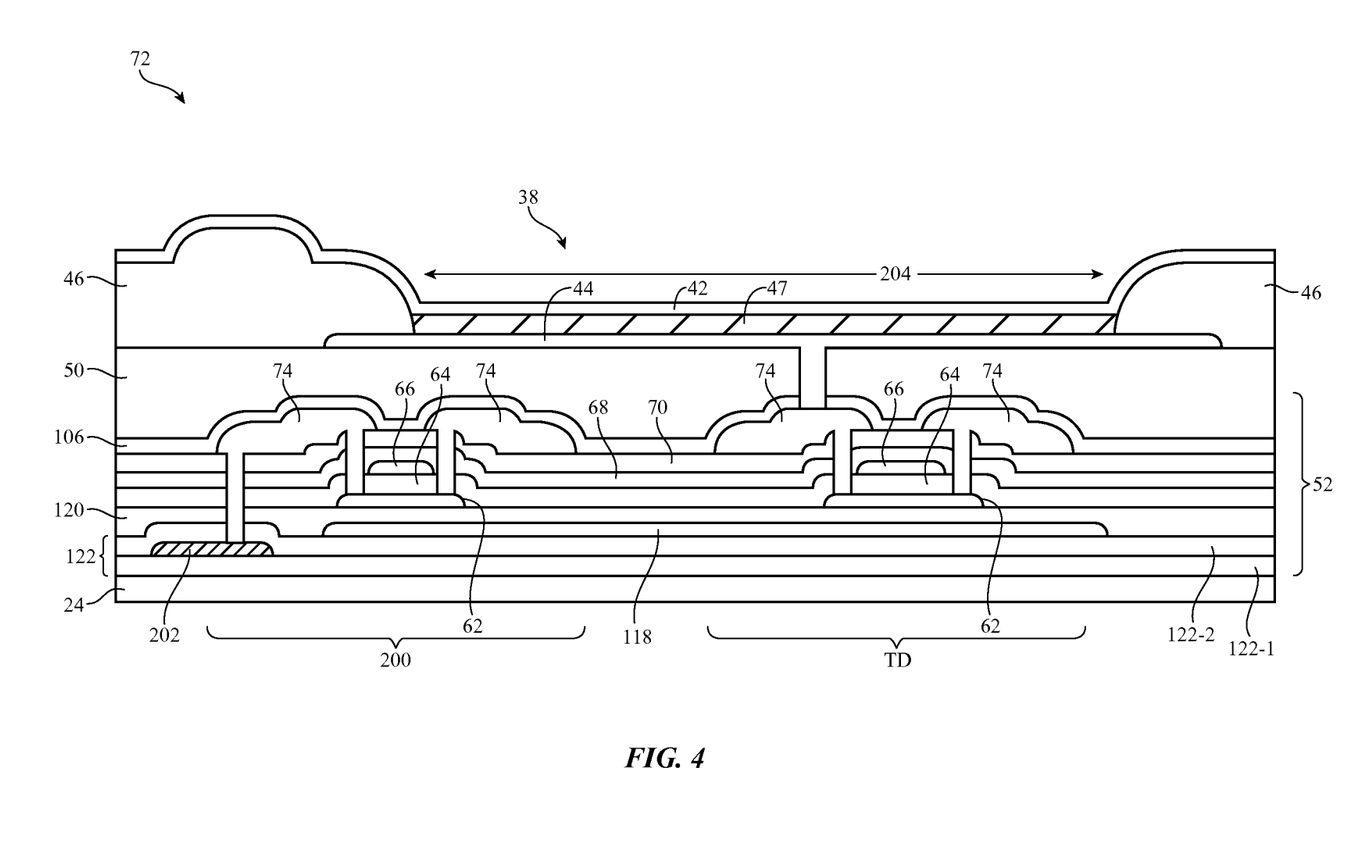
FIG. 4 is a cross-sectional side view of an organic light-emitting diode and associated thin-film structures in which a metal layer is interposed between first and second buffer layers in accordance with an embodiment.

Organic light-emitting diode pixels such as subpixel 22SUB of FIG. 3 may use thin-film transistor structures of the type shown in FIG. 4. As shown in FIG. 4, pixel circuitry 72 may include pixel structures such as light-emitting diode cathode layer 42 (e.g., a transparent conductive layer such as a layer of indium tin oxide that forms cathode terminal CD of FIG. 3) and light-emitting diode anode layer 44 (e.g., a patterned metal layer that forms anode terminal A of FIG. 3). Organic light-emitting diode emissive material 47 may be interposed between cathode 42 and anode 44, thereby forming light-emitting diode 38.

Dielectric layer 46 may have an opening that serves to define the layout of the light-emitting diode for each subpixel (e.g., alignment of the emissive material 47 with respect to anode 44) and may sometimes be referred to as a pixel definition layer. Planarization layer 50 (e.g., an organic polymer layer) may be formed on top of thin-film transistor structures 52. Thin-film transistor structures 52 may be formed on substrate 24. Substrate 24 may be rigid or flexible and may be formed from glass, ceramic, crystalline material such as sapphire, polymer (e.g., a flexible layer of polyimide or a flexible sheet of other polymer material), etc.

Thin-film transistor structures 52 may include silicon transistors such as silicon transistors or thin-film transistors formed from other semiconductors (e.g., semiconducting oxides such as indium gallium zinc oxide). In the illustrative configuration of FIG. 4, circuitry 72 includes switching transistor 200 and drive transistor TD, which have semiconducting channel regions 64 formed from polysilicon semiconductor layer 62.

The channel regions formed from semiconductor layer 62 may be covered by gate insulator layer 64 (e.g., a layer of silicon oxide or other inorganic layer). Transistor gates 66 may be formed from a gate layer such as a layer of patterned metal (e.g., molybdenum, as an example). Gates 66 may be covered by a layer of interlayer dielectric (e.g., silicon oxide layer 68, silicon nitride layer 70, and/or other oxide and nitride layers or other organic or inorganic layers). Source-drain layer 74 may be a layer of metal that is patterned to form transistor source-drain terminals for transistors in circuitry 72 such as transistors 200 and TD. Each transistor may have a pair of source-drain terminals connected to opposing sides of the channel 62 of that transistor.

Circuitry 72 may also include capacitor structures such as capacitors Cst1 and Cst2 of FIG. 3. The capacitor structures may have electrodes that are formed from conducting layers in circuitry 72. The electrodes may be separated by an interposed dielectric layer (e.g., one or more of the dielectric layers of FIG. 4).

An inorganic passivation layer such as passivation layer 106 may be interposed between polymer (organic) passivation layer 50 and source-drain layer 74 (and dielectric layer 70). Layer 106 may be formed from silicon nitride or other dielectric.

Buffer layer 122 may be formed on substrate 24. Buffer layer 122 may be formed from one or more layers of inorganic dielectric material or other dielectric. As an example, buffer layer 122 may include lower buffer layer 122-1 on substrate 24 and upper buffer layer 122-2 on layer 122-1. Layers 122-1 and 122-2 may be formed from silicon oxide, silicon nitride, oxynitride, or other dielectric materials. Layer 122 may help to block impurities from substrate 24 (e.g., glass impurities) and thereby prevent these impurities from degrading the performance of the thin-film transistors of thin-film transistor circuitry 52.

Back-side metal layer 118 may be formed under the thin-film transistors (e.g., transistors 200 and TD in the example of FIG. 4) to serve as a shield layer that shields the transistors from charge in buffer layer 122. Buffer layer 120 may be formed over shield layer 118 and may be formed from a dielectric (e.g., an organic or inorganic layer).

To help enhance the aperture ratio of the pixels of display 14, anode layer 44 can be used exclusively or nearly exclusively for forming anodes A. With this type of approach, additional signal paths for display 14 such as the Vini lines in display 14 can be formed using portions of other metal layers and need not be formed from the metal of the anode layer.

In the example of FIG. 4, for example, circuitry 72 has been provided with additional metal layer 202. Metal layer 202 is interposed between lower buffer layer 122-1 and upper buffer layer 122-2 and is a different layer of material than the layer of material used in forming the anodes in display 14. Because layer 202 is not formed in same layer of material as anode layer 44, there is additional space available in anode layer 44 for forming organic light-emitting diodes 38. This allows the size of openings such as opening 204 in pixel definition layer 46 and the lateral dimensions of anodes A formed from anode layer 44 to be increased without risk of creating undesired short circuit paths between anode A and the initialization voltage line or other signal paths. The increased size of opening 204 and associated increase in size of the anode and emissive layer material 47 in diode 38 increases pixel aperture ratio (e.g., subpixels 22SUB such as blue subpixels and potentially other subpixels in display 14 can have an enhanced anode size and emissive layer size and can therefore emit more light than would otherwise be possible in a given pixel area).

The conductive layers of FIG. 4 may, if desired, be used in forming capacitors for pixels 22 (see, e.g., Cst1 and Cst2 of FIG. 3). As an example, portions of a metal layer such as layer 202 may be used in forming a capacitor electrode. Semiconductor layer 62 and/or gate layer 66 may also be used in forming capacitor electrodes. In some capacitor designs, the capacitor has upper and lower electrodes separated by a layer of dielectric. In other capacitor designs, the capacitor has first, second, and third stacked electrodes separated by first and second respective interposed dielectric layers. The dielectric layers in the capacitors can include one or more sublayers. In an arrangement of the type shown in FIG. 4, dielectric layers for capacitors may be formed from layers such as layers 122-2, 120, and 64. For example, a capacitor may have electrodes formed from layers 202 and 62 that are separated by dielectric 122-2 and 120. As another example, a capacitor may have electrodes formed from layers 202 and 66 that are separated by dielectric 122-2, 120, and 64. Other capacitor arrangements may be used if desired. These electrode and dielectric layer configurations are merely illustrative.

Figure 5:
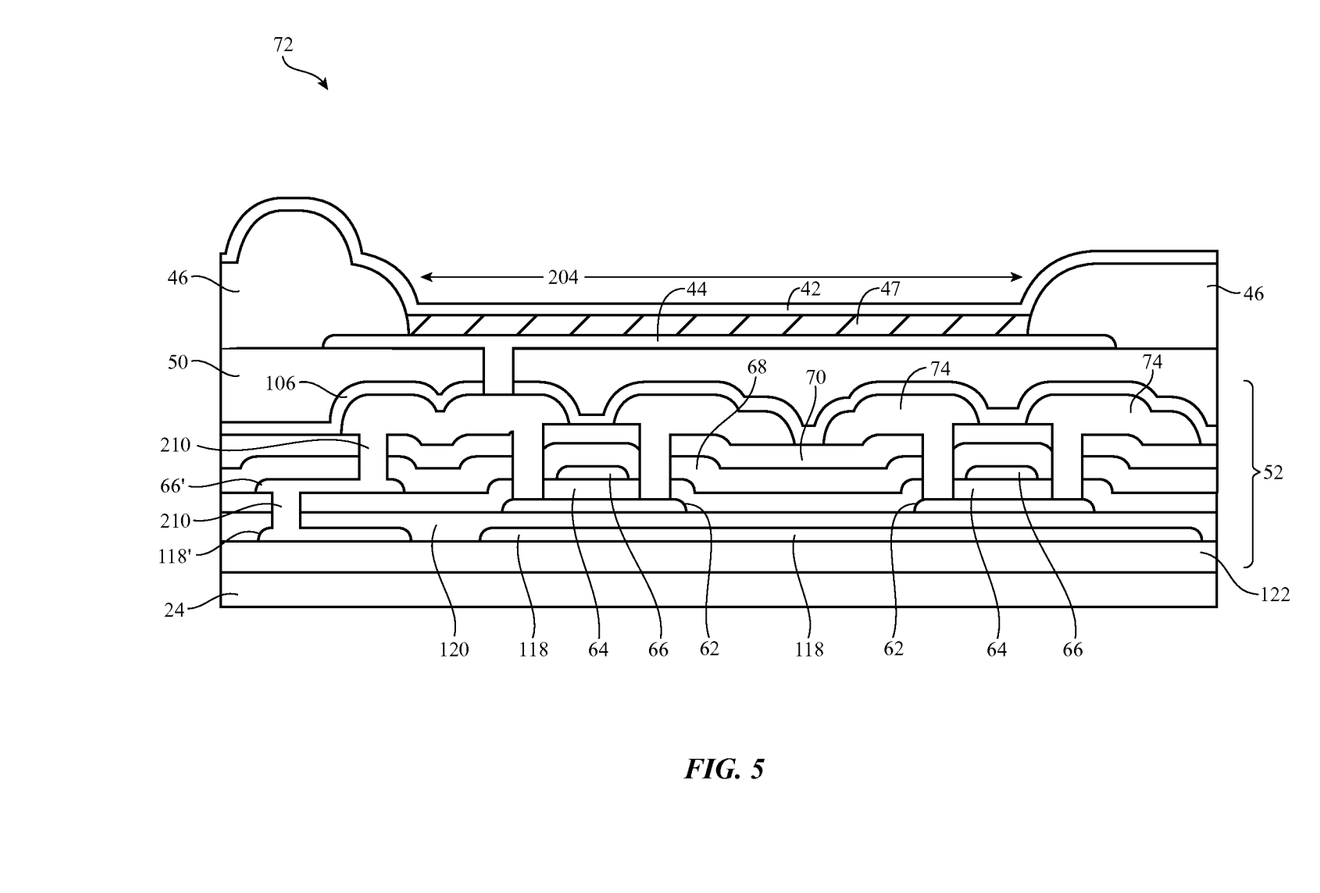
FIG. 5 is a cross-sectional side view of an organic light-emitting diode and associated thin-film structures in which a signal path such as an initialization voltage path has been formed from a portion of a metal shield layer in accordance with an embodiment.

In the illustrative configuration of FIG. 5, portion 118' of metal shield layer 118 has been patterned to form a separate conductive structure. The separate conductive structure formed from portion 118' of layer 118 may, for example, be used to form initialization voltage line Vini.

As shown in FIG. 5, layer 118' may be shorted to source-drain layer 74 using vias 210. A single via 210 may pass through the intervening dielectric layers to connect layer 74 directly to layer 118' or, as shown in FIG. 5, portion 66' of gate metal layer 66 may be used in coupling layers 74 and 118' together (e.g., so that two shorter vias 210 can be used in place of one taller via).

The structures of FIG. 5 may be used in forming capacitors such as capacitors Cst1 and Cst2. For example, portions of layer 118' may be used in forming a capacitor electrode. Semiconductor layer 62 and/or gate layer 66 may also be used in forming capacitor electrodes. Dielectric layers for capacitors may be formed from layers such as layers 120 and 64. For example, a capacitor may have electrodes formed from layers 118' and 62 that are separated by dielectric 120 and/or a capacitor may have electrodes formed from layers 118' and 66 that are separated by dielectric 120 and 64 (as examples).

Figure 6:
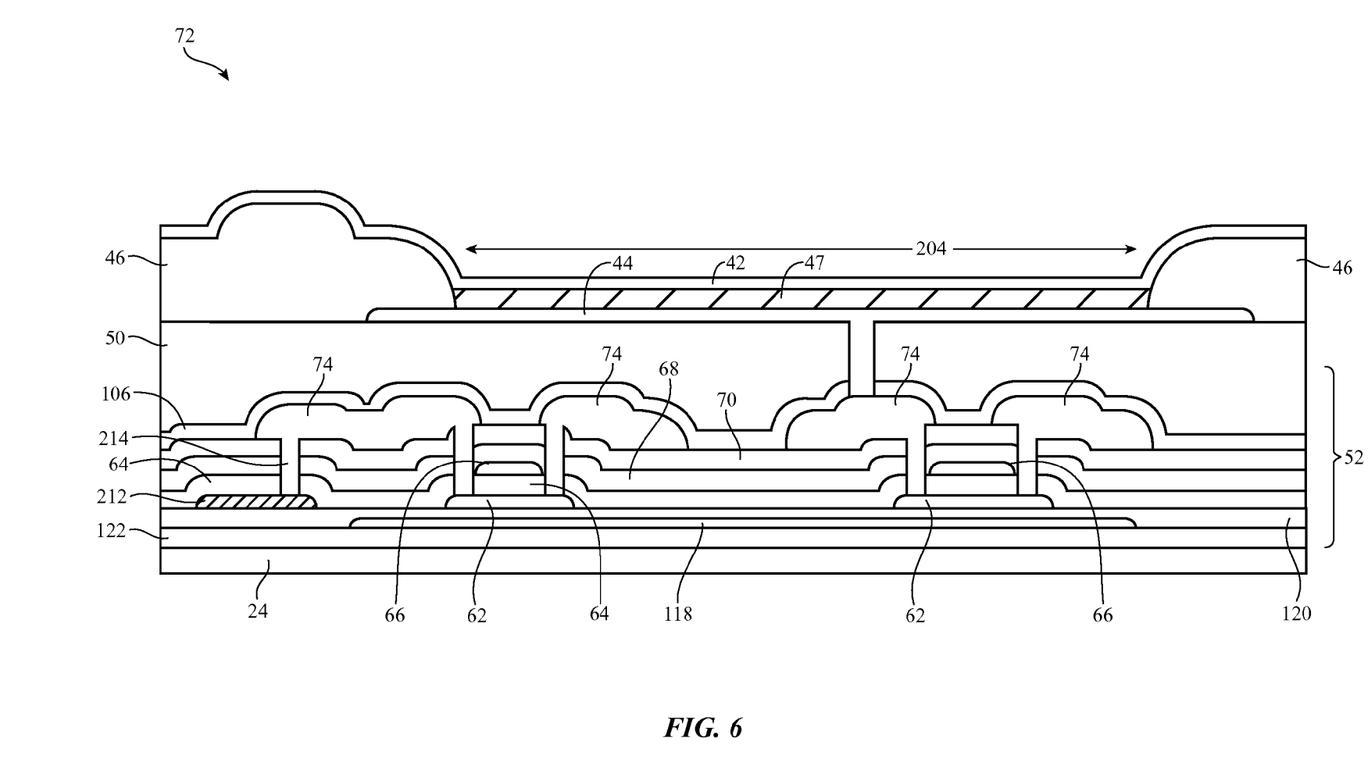
FIG. 6 is a cross-sectional side view of an organic light-emitting diode and associated thin-film structures in which a signal path such as a voltage initialization path has been formed from a metal layer interposed between a gate insulator layer and a buffer layer in accordance with an embodiment.

In the illustrative configuration of FIG. 6, metal layer 212 has been used to form conductive structures for display 14. Layer 212 may be used, for example, to form a signal path such as voltage initialization line Vini. As shown in FIG. 6, metal layer 212 may be interposed between buffer layer 122-2 and gate insulator layer 64. A via such as via 214 may be used to electrically couple layer 212 to other layers such as metal source-drain layer 74 (e.g., via 214 may be connected directly between layer 212 and source-drain layer 74). Metal layer 212 may be located in the same layer of circuitry 72 as semiconductor layer 62. Metal layer 212 may be patterned after completing the patterning and doping of layer 62.

The structures of FIG. 6 may be used in forming capacitors such as capacitors Cst1 and Cst2. For example, portions of layer 212 may be used in forming a capacitor electrode. Metal layers such as gate layer 66 may also be used in forming capacitor electrodes. A capacitor may, for example, have electrodes formed from layers 212 and 66 that are separated by dielectric 64 (as an example).

Figure 7:
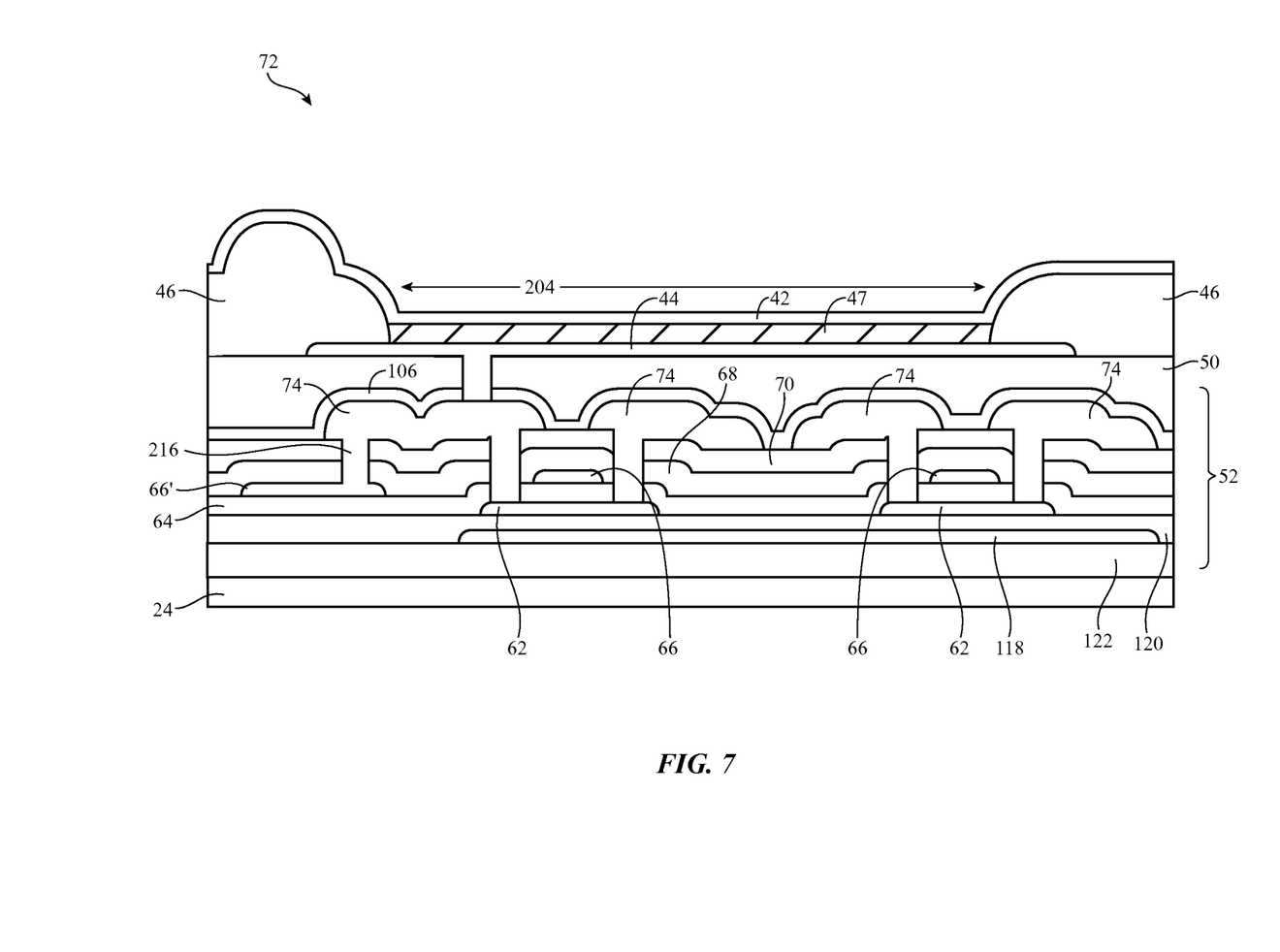
FIG. 7 is a cross-sectional side view of an organic light-emitting diode and associated thin-film structures in which a signal path such as a voltage initialization path has been formed from a portion of a gate metal layer in accordance with an embodiment.

In the illustrative configuration of FIG. 7, conductive structures for display 14 such as voltage initialization line Vini have been formed from a portion of gate layer 66 such as portion 66'. As shown in FIG. 7, metal gate layer 66' may be interposed between dielectric layer 64 and dielectric layer 68. Via 216 may pass through dielectric layers 68 and 70 and may connect gate layer 66' to source-drain layer 74.

The structures of FIG. 7 may be used in forming capacitors such as capacitors Cst1 and Cst2. For example, portions of the gate metal layer may be used in forming a capacitor electrode, active semiconductor layer 62 may form a capacitor electrode, and dielectric layer 64 may be interposed between these electrodes (as an example).

Figure 8:
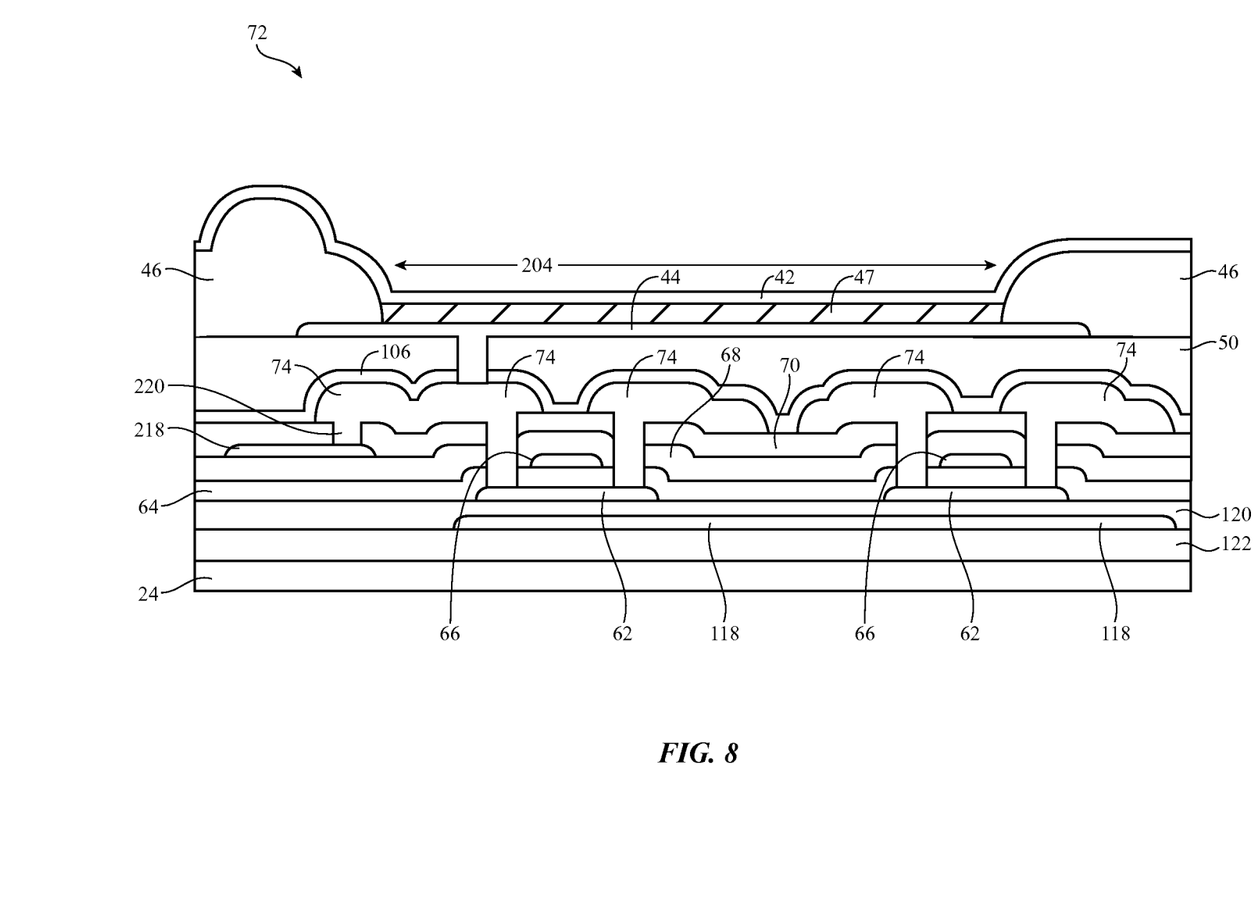
FIG. 8 is a cross-sectional side view of an organic light-emitting diode and associated thin-film structures in which a metal layer that is located between first and second interlayer dielectric layers is used in forming an initialization voltage path in accordance with an embodiment.

In the illustrative configuration of FIG. 8, conductive structures for display 14 such as voltage initialization line Vini have been formed from metal layer 218. Metal layer 218 may be interposed between dielectric layers 68 and 70 and may be electrically connected to source-drain layer 74 by via 220 through layer 70.

Layer 218 may be used in forming capacitors for circuitry 72 such as capacitors Cst1 and Cst2. For example, layer 218 may form a capacitor electrode and metal from gate metal layer 66 may form a capacitor electrode. The electrodes formed from layers 218 and 66 may be separated by interposed dielectric layer 68. Capacitors may also be formed using portions of layer 218 and portions of source-drain layer 74 as electrodes that are separated by interposed dielectric layer 70.

Figure 9:
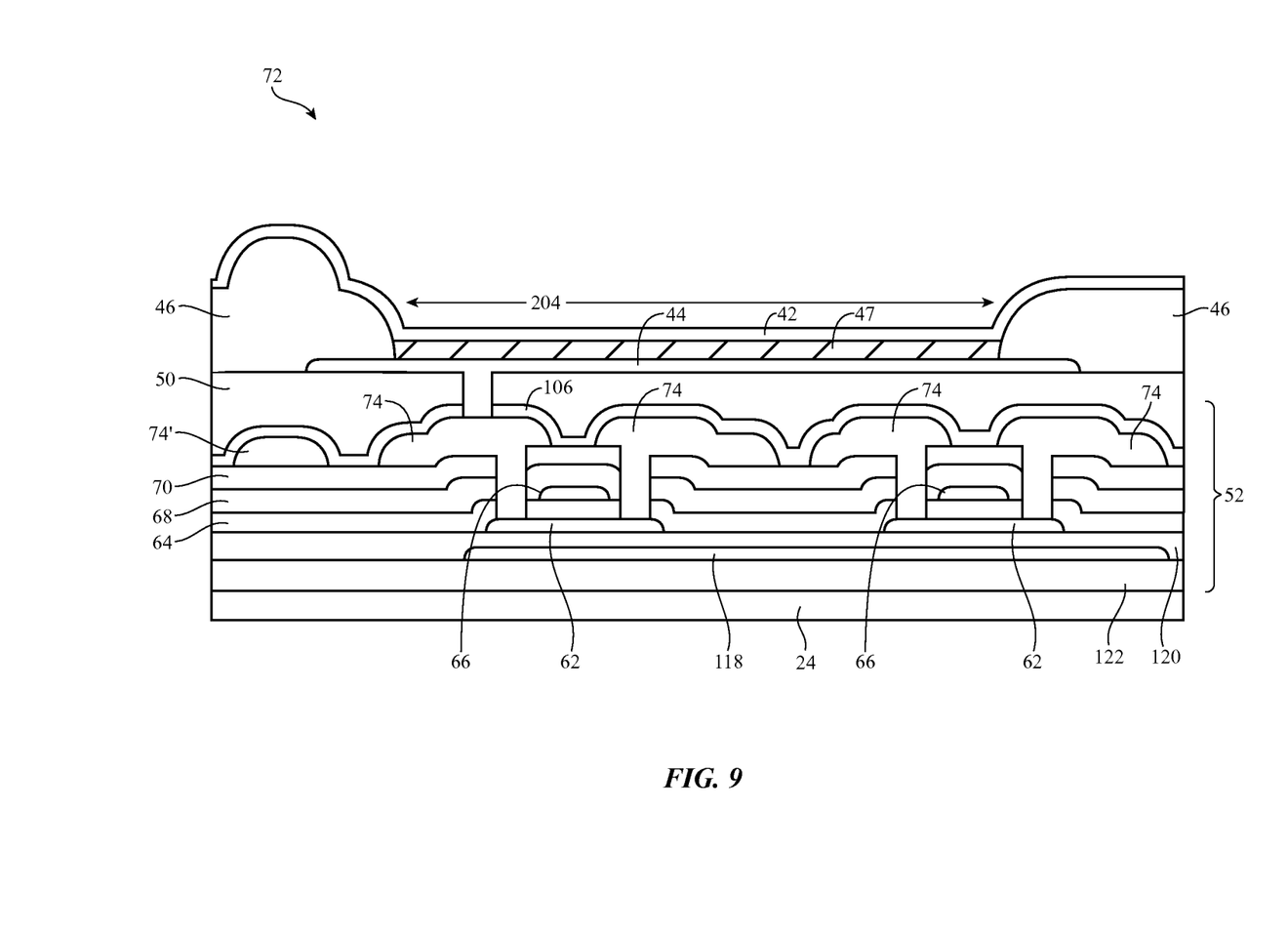
FIG. 9 is a cross-sectional side view of an organic light-emitting diode and associated thin-film structures in which a metal layer that is formed from a portion of a source-drain metal layer is used in forming an initialization voltage path in accordance with an embodiment.

In the illustrative configuration of FIG. 9, conductive structures for display 14 such as voltage initialization line Vini have been formed from portion 74' of source-drain metal layer 74.

If desired, portions of source-drain layer 74 such as portion 74' may be used in forming capacitors for circuitry 72 such as capacitors Cst1 and Cst2. For example, layer 74' may form a capacitor electrode and metal from gate metal layer 66 may form a capacitor electrode. The electrodes formed from layers 74' and layer 66 may be separated by interposed interlayer dielectric layers 68 and 70.

Figure 10:
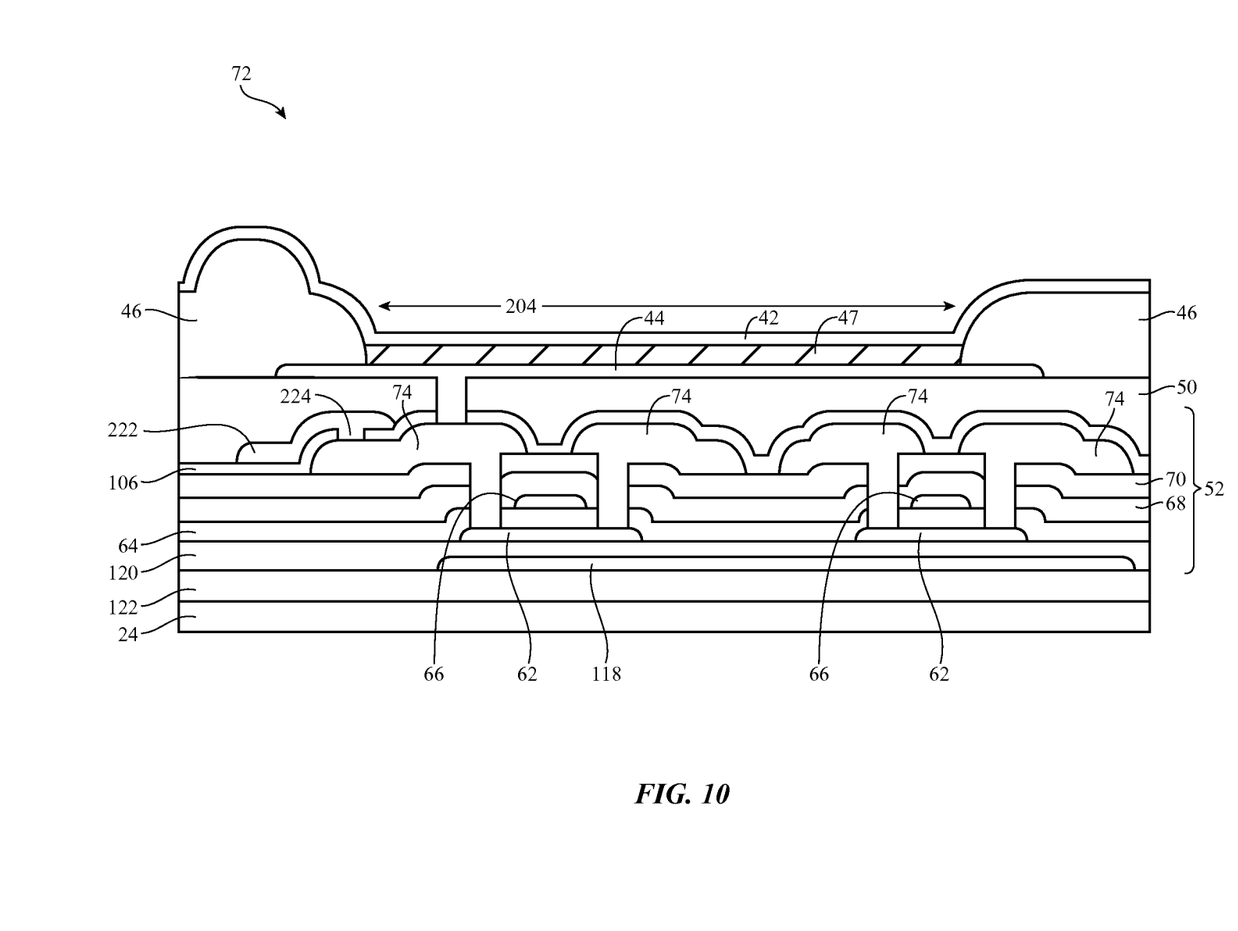
FIG. 10 is a cross-sectional side view of an organic light-emitting diode and associated thin-film structures in which a metal layer that is located above a source-drain metal layer and below an anode layer is used in forming an initialization voltage path in accordance with an embodiment.

In the illustrative configuration of FIG. 10, conductive structures for display 14 such as voltage initialization line Vini have been formed from metal layer 222. Metal layer 222 may be interposed between dielectric layers 50 and 106. Vias such as via 224 may pass through layer 106 to electrically couple layer 222 to source-drain layer 74. If desired, portions of layer 222 may be used in forming capacitors for circuitry 72 such as capacitors Cst1 and Cst2. For example, layer 222 may form a capacitor electrode and metal from source-drain layer 74 may form a capacitor electrode. The electrodes formed from layers 74 and 222 may be separated by interposed dielectric layer 106.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   an array of pixels each of which has an organic light-emitting diode having an anode and a cathode and each of which has thin-film transistor circuitry with transistors that include at least one drive transistor and at least one switching transistor;
   horizontal control lines that are coupled to gates in the transistors and that supply control signals to rows of the pixels in the array;
   data lines associated with columns of the pixels in the array; and
   initialization voltage lines associated with columns of the pixels in the array, wherein in each pixel the switching transistor couples one of the voltage initialization lines to the anode of the organic light-emitting diode in that pixel, wherein the thin-film transistor circuitry includes a semiconductor layer that forms semiconductor channels for the transistors, a gate insulator layer adjacent to the semiconductor layer, a gate layer that is adjacent to the gate insulator layer and that is patterned to form the gates, a source-drain layer that is patterned to form source-drain terminals for the transistors, a dielectric layer on the source-drain layer, a metal anode layer that is patterned to form the anodes in the pixels, an organic passivation layer that is interposed between the dielectric layer and the metal anode layer, and an additional metal layer that is not formed from a portion of the metal anode layer and that is patterned to form the voltage initialization lines.

2. The display defined in claim 1 wherein the additional metal layer is interposed between the dielectric layer and the organic passivation layer.

3. The display defined in claim 2 further comprising a via that passes through the dielectric layer and that electrically connects the additional metal layer to the source-drain layer.

4. The display defined in claim 3 wherein the dielectric layer comprises a silicon nitride layer.

5. The display defined in claim 2 wherein the thin-film transistor circuitry of each pixel comprises a capacitor and wherein the additional metal layer has a portion that is patterned to form an electrode for the capacitor.

6. The display defined in claim 5 wherein the source-drain layer has a portion that forms an additional electrode for the capacitor in each pixel and wherein the dielectric layer is interposed between the portion of the additional metal layer that is patterned to form the electrode for the capacitor and the portion of the source-drain layer that forms the additional electrode.

7. The display defined in claim 6 further comprising interlayer dielectric interposed between the source-drain layer and the gate layer.

8. The display defined in claim 1 further comprising:
   a metal shield layer under the transistors;
   a first dielectric buffer layer, wherein the first dielectric buffer layer is interposed between the metal shield layer and the semiconductor layer; and
   a second dielectric buffer layer, wherein the second dielectric buffer layer is interposed between the additional metal layer and the metal shield layer.

9. The display defined in claim 1 further comprising:
   a metal shield layer under the transistors;
   a first dielectric buffer layer, wherein the first dielectric buffer layer is interposed between the metal shield layer and the semiconductor layer; and
   a second dielectric buffer layer, wherein the metal shield layer is interposed between the first and second dielectric buffer layers and wherein the additional metal layer is a interposed between the first dielectric buffer layer and the gate insulator layer.

10. The display defined in claim 1 further comprising:
    an interlayer dielectric layer between the source-drain layer and the gate layer, wherein the additional metal layer is interposed between the interlayer dielectric layer and the gate insulator layer and is formed from a portion of the gate layer.

11. The display defined in claim 1 wherein the additional metal layer is formed from a portion of the source-drain layer.

12. A display, comprising:
    an array of pixels each of which has an organic light-emitting diode having an anode and a cathode and each of which has thin-film transistor circuitry with transistors including at least one drive transistor and at least one switching transistor;
    horizontal control lines that are coupled to gates in the transistors and that supply control signals to rows of the pixels in the array;
    data lines associated with columns of the pixels in the array; and
    initialization voltage lines associated with columns of the pixels in the array, wherein in each pixel the switching transistor couples one of the voltage initialization lines to the anode of the organic light-emitting diode in that pixel, wherein the thin-film transistor circuitry includes a semiconductor layer that forms semiconductor channels for the transistors, a gate insulator layer adjacent to the semiconductor layer, a gate layer that is adjacent to the gate insulator layer and that is patterned to form the gates, a source-drain layer that is patterned to form source-drain terminals for the transistors, a dielectric layer on the source-drain layer, a metal anode layer that is patterned to form the anodes in the pixels, an organic passivation layer that is interposed between the dielectric layer and the metal anode layer, and a portion of the gate layer that is patterned to form the voltage initialization lines.

13. The display defined in claim 12 further comprising an interlayer dielectric layer interposed between the gate layer and the source-drain layer.

14. The display defined in claim 13 further comprising a via that passes through the interlayer dielectric layer to electrically connect the gate layer to the source-drain layer.

15. The display defined in claim 14, wherein the via electrically connects the voltage initialization lines formed from the portion of the gate layer to the source-drain layer.

16. The display defined in claim 15 further comprising an additional interlayer dielectric layer interposed between the gate layer and the source-drain layer.

17. The display defined in claim 16, wherein the via passes through the additional layer dielectric layer to electrically connect the voltage initialization lines to the source-drain layer.

* * * * *